(12) United States Patent
Yamamoto et al.

(10) Patent No.: US 6,707,073 B1
(45) Date of Patent: Mar. 16, 2004

(54) SEMICONDUCTOR LASER DEVICE WITH PRESS-FORMED BASE AND HEAT SINK

(75) Inventors: Takeshi Yamamoto, Kyoto (JP); Masayoshi Muranishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/605,427

(22) Filed: Jun. 29, 2000

(30) Foreign Application Priority Data

Jun. 29, 1999 (JP) ............................................. 11-183992
Jun. 29, 1999 (JP) ............................................. 11-184031

(51) Int. Cl.⁷ ............................................. H01L 29/22
(52) U.S. Cl. ........................... 257/99; 257/98; 257/100; 257/711
(58) Field of Search ............................ 257/98, 99, 82, 257/711, 680, 100

(56) References Cited

U.S. PATENT DOCUMENTS 4,267,559 A * 5/1981 Johnson et al. ............. 257/100
4,920,404 A * 4/1990 Shrimali et al. ............. 357/70
5,089,861 A * 2/1992 Tanaki et al. ................. 357/17
5,212,699 A * 5/1993 Masuko et al. ............... 372/34
5,262,675 A * 11/1993 Bausman, Jr. ............... 257/680
5,452,389 A * 9/1995 Tonai et al. ................... 385/92
5,514,475 A * 5/1996 Nawa et al. ............... 428/411.1
5,801,873 A * 9/1998 Byker ........................ 359/272
5,878,069 A * 3/1999 Kamibayashi et al. ........ 372/36

* cited by examiner

Primary Examiner—Nathan J. Flynn
Assistant Examiner—Leonardo Andújar
(74) Attorney, Agent, or Firm—Sughrue Mion, PLLC (57) ABSTRACT

In order to manufacture a stem in a semiconductor laser device from a thin sheet metal by a pressing operation, a base is formed with an annular wall by pressing the thin sheet metal. Outer leads are disposed in a space which is formed within the annular wall. The leads are fixed by charging and curing an insulating thermosetting resin. A mounting for mounting a silicon sub-mount on said base is formed integrally with said base by a pressing operation. Lacking of strength and heat dissipation due to the fact that the stem is formed of a thin metal plate is compensated for by the formation of said continuous wall.

13 Claims, 8 Drawing Sheets

SEMICONDUCTOR LASER DEVICE WITH PRESS-FORMED BASE AND HEAT SINK

BACKGROUND OF THE INVENTION

1. Technical Field

The present invention relates to a semiconductor laser device having a stem which is formed by pressing a thin sheet metal, and in particular to a semiconductor laser device having an enhanced heat dissipation.

2. Description of Related Prior Art

Figure 10:
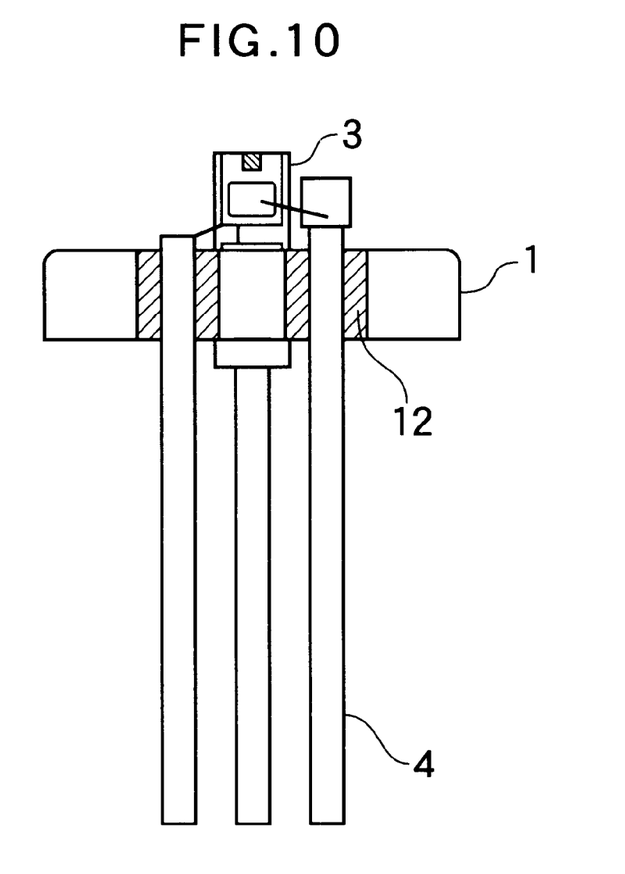
FIG. 10 is a sectional view showing the stem of the prior art semiconductor laser device.

A stem of the prior art semiconductor laser device, for example as shown in FIG. 10, comprises a base 1, outer leads 4 which are fixed to the base 1 and a heat sink 3 which is a mounting of a silicon sub-mount on which a semiconductor laser light emitting element and the like are mounted. The base 1 is generally formed by forging a disc of an iron having a thickness of 1.2 mm and a diameter of 5.6 mm in a press die. At this time, the heat sink 3 is formed by either pressing and swaging the peripheral edge of the disc or raising the central portion of the disc. The outer leads 4 are fixed to the base by means of an electrically insulating fusing glass 12.

However, since the prior art for manufacturing the stem has such problems as following, it is difficult to decrease the manufacturing cost.

(1) The forging dies use thick metal sheets, resulting in a high cost of material and are liable to wear and to be broken.

(2) Since, a high precision is required for the size of the lateral sides of the base of the stem, forging of the peripheral edge of the disc as well as working of the lateral sides thereof is necessary in case in which manufacturing is achieved by forging.

(3) Bonding between the base and outer lead is conducted by using a low melting point glass having a melting point of about 1000° C. Since this melting point is higher than that of gold, plating of the outer lead with gold should be conducted after the leads have been bonded to the base. Accordingly, gold plating should be conducted to meet the requirements of the outer leads although it inherently suffices to plate the base with Ni and the like in the prior art.

The base may be reduced in size for reducing the mounting area if the heat dissipation does not matter so much on mounting on an optical pickup.

Reduction in mounting area for the base which has been formed by a conventional forging method can not be conducted without any cutting work. A simple method such as stamping a blank can not be adopted.

In order to solve such a problem, it may be devised that the base of the stem be formed from a thin sheet metal having a thickness of about 0.1 mm to 0.5 mm by a pressing technique. Unlike the prior art in which the base of the stem is stamped from the relatively thick sheet metal of about 1.2 mm by forging, use of a thin sheet metal provides problems such as low, mechanical strength, bending and warping, as well as a problem that the heat dissipation characteristics is not sufficient in some cases.

With recent development of the light emitting diodes which emit short wave length light and high power light emitting elements, stems having a high heat dissipation ability have been demanded.

SUMMARY OF THE INVENTION

The present invention was made in order to solve the above-mentioned problems.

(1) The present invention provides a semiconductor laser device including a stem having a base, a mounting for an laser light emitting element and the like, which is integrally formed on the base, and outer leads, wherein said base is formed by bending a sheet metal so that it has an annular wall.

(2) In a semiconductor laser device of the present invention, said annular wall is formed by bending a sheet metal so that it is spaced from the peripheral edge thereof and the mounting for said laser light emitting element and the like is formed on said annular wall by erecting the upper face of the sheet metal.

(3) In a semiconductor laser device of the present invention, said annular wall is formed by bending a sheet metal so that it is spaced from the peripheral edge thereof and in that the mounting for said laser light emitting element and the like is formed on said annular wall by erecting the upper face of the sheet metal.

(4) In a semiconductor laser device of the present invention, said outer leads are bonded to said base with a thermosetting resin which is charged within said annular wall.

(5) In a semiconductor laser device of the present invention, said outer leads and said base are plated with different materials.

(6) In a semiconductor laser device of the present invention, said annular wall is a heat dissipating fin.

(7) In a semiconductor laser device of the present invention, said stem comprises a base having at its peripheral edge an annular wall which is formed by bending a sheet metal and a heat sink member is sealed in said annular wall.

(8) In semiconductor laser device of the present invention, said heat sink is an insulated copper material.

(9) In a semiconductor laser device of the present invention, said stem comprises a base having at its peripheral edge an annular wall which is formed by bending a cladding material in which two metals having different heat conductivities are cladded to each other in a stripe manner and in that a mounting for the laser light emitting element, which is integrally formed on at least said base is formed of a metal having a higher heat conductivity of said different metals.

(10) In a semiconductor laser device of the present invention, said stem comprises a base having at its peripheral edge an annular wall which is formed by bending a cladding material in which two metals having different heat conductivities are cladded to each other in a stripe manner and only a mounting for the laser light emitting element, which is integrally formed on said base is formed of a metal having a higher heat conductivity of said different metals.

(11) In a semiconductor laser device of the present invention, one of the metals having different heat conductivities is iron and the other is copper.

(12) In a semiconductor laser device of the present invention, comprising a stem having a base, a mounting for mounting an laser device and like and outer leads, said base has an annular wall which is formed by bending a sheet metal; said mounting for mounting the laser light emitting element and the like is mounted on said outer leads; and said outer leads are bonded to said base with a thermosetting resin which is sealed in said annular wall.

(13) In a semiconductor laser device of the present invention set-forth in the preceding paragraph, said heat sink member is also sealed in said annular wall.

Corresponding to the feature as defined in each of the foregoing paragraphs, the present invention provides the advantage as follows:

(1) Since a thin sheet metal is subjected to relatively simple pressing operations such as punching and bending, wear and break of a die is hard to occur. Accordingly, the stem can be formed at a low cost. Even if reduction in pickup mounting area is required, the base can be easily cut only by punching it in a press machine. Since the annular wall is formed by bending a sheet metal, the outer leads can be sealed in an inner space with a thermosetting resin. The strength can be assured although the sheet metal is thin.

(2) Since the thermosetting resin for fixing terminals is curable at low temperatures, the gold-plated terminals can be fixed to the stem. Accordingly, the terminals and the base of the stem can be plated with different materials.

(3) The annular wall can be used as heat dissipating fin and a suitable heat dissipating area can be obtained by adjusting its length.

(4) Heat dissipating ability can be assured by the annular wall formed on the peripheral edge of the base and the heat sink member. The heat dissipating characteristics of the annular wall and the heat sink member can be optimized depending upon the applied semiconductor laser device by adjusting the width of the annular wall and the thickness of the heat sink member.

(5) Since use of materials which are excellent in heat conducting characteristics for unnecessary portion can be considerably restricted, a semiconductor laser device which is excellent in heat dissipation can be obtained at a reduced cost.

(6) Since a material which is excellent in heat conductivity may be combined with a material which is excellent in strength in such a manner that respective characteristics can be advantageously used, a semiconductor laser device having excellent strength and heat dissipating characteristics can be obtained at a reduced cost.

(7) Use of a cladding material comprising a copper and iron materials provides a low cost stem having both high strength and heat dissipation. Accordingly, a semiconductor laser device having an excellent performance can be obtained at a low cost.

DETAILED DESCRIPTION OF THE INVENTION

Figure 1A:
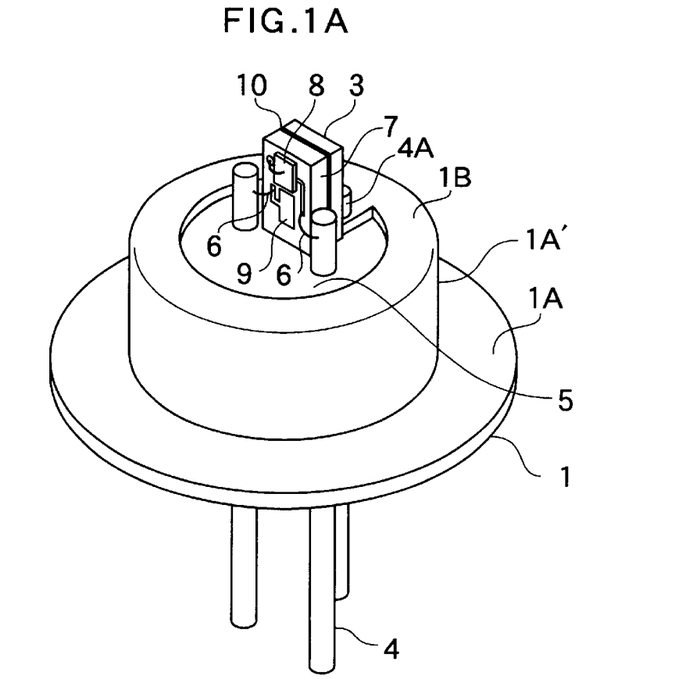
FIGS. 1A and 1B show the stem of the first embodiment of the semiconductor laser device of the present invention, FIGS. 1A and 1B being a perspective and sectional views showing the stem, respectively.
Figure 1B:
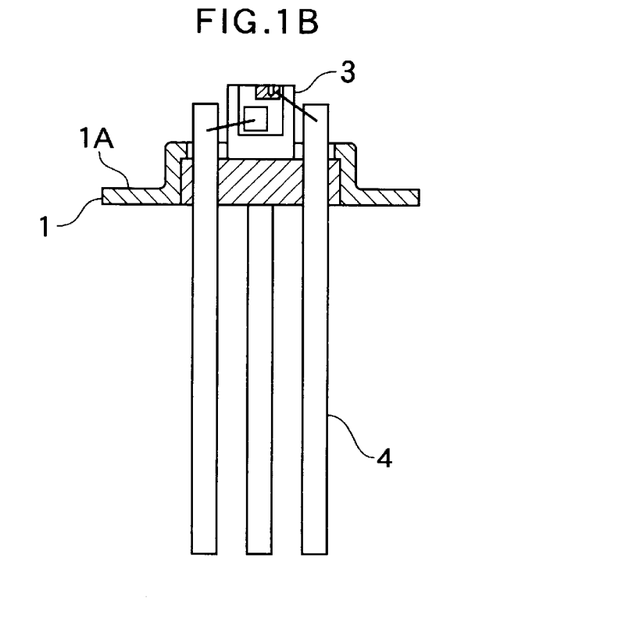

FIGS. 1A and 1B are a perspective and sectional views showing a first embodiment of a stem of the present invention, respectively. As shown in the drawing, a base 1 of a stem and a heat sink are formed by stamping a disc-shaped blank from a thin sheet metal, for example, a sheet metal having a thickness of 0.1 mm to 0.5 mm and subjecting the stamped blank to sheet So metal workings. An annular continuous wall 2 is formed by bending the central portion of the disc excepting a peripheral edge 1A which is in the form of collar. The annular wall 2 is formed at its inner portion integrally with a mounting (heat sink) 3 on which a laser light emitting element and the like is mounted through a silicon sub-mount.

In the drawing, a reference numeral 6 denotes gold wires which electrically connect leads 4 to each terminal. 7 denotes a silicon sub-mount which is bonded to the folded face 3A (FIG. 2) of the mounting (heat sink) 3 with an electrically conductive paste such as silver paste. 8 denotes an LD (laser diode) which is a light emitting element and 9 denotes a light receiving element for monitoring laser light which is emitted from said LD. As shown in the drawing, both LD 8 and the light receiving element 9 are electrically connected to the leads 4 via the gold wires 6.

Figure 2A:
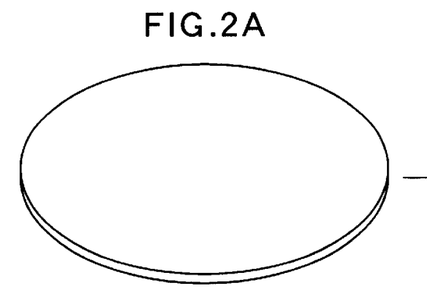
FIGS. 2A–2D provide a schematic view illustrating a process for manufacturing the base of the stem of the first embodiment.
Figure 2B:
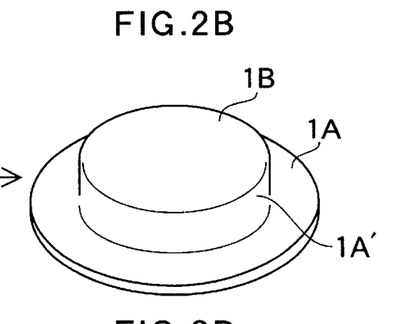
Figure 2C:
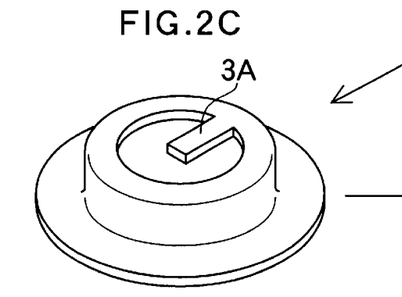
Figure 2D:
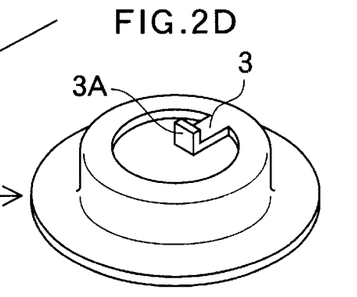

FIGS. 2A–2D are schematic views for explaining the steps of forming the base of the stem. FIG. 2A shows a blank which is for example sheet metal such as iron. FIG. 2B shows an intermediate work piece in the form of an ashtray or hat, comprising a collar 1A, an annular wall 1A' adjacent thereto and a flat face on the annular wall 1A'. FIG. 2C shows that the flat face of the thus formed intermediate work piece has been punched to leave a portion 3A which will become a mounting 3 serving as a heat sink. FIG. 2D shows that the heat sink 3 having an L-shaped section is finally formed by erecting the portion 3A on which the device will be mounted.

Three outer leads 4 are disposed in a space which is surrounded by the annular wall 1A' of the base 1 which has been formed in accordance with the above-mentioned steps. Under this condition, the space is charged with a thermosetting resin 5 to secure the outer leads to the base (FIG. 1).

To assure the electrical conductance on bonding, a ground terminal 4A extends through the mounting (heat sink) 3 as shown in the drawings.

In this embodiment, bonding between the base 1 and the leads 4 is not conducted with conventional low melting point glass, but is conducted with a thermosetting resin 5. Since the thermal setting of the resin is conducted at only about 200° C., use of the thermosetting resin allows the outer lead 4 to the base after they have been plated with gold.

In brief, since the base 1 and the leads 4 can be independently subjected to plating, it is not necessary to plate the base 1 with gold as is done for the outer leads 4. It is possible to plate the base 1 with, for example, Ni. Even if reduction in the area of pickup mounting is required, the base 1 can be easily cut by punching it in a press.

An electrically conductive paste such as silver paste is used as DB (die-bonding) material to provide a necessary bonding strength.

Although the stem of the above-mentioned first embodiment of the present invention can overcome the problem of the prior art, the base 1 has a thickness of about 0.25 to 0.2 mm which is lower than that of the prior art (about 1.2 mm). Accordingly, the strength on application on the pickup is so low that a problem of bending and warping may take place. The heat dissipation characteristics is not sufficient in some cases. The heat dissipating ability is not sufficient.

Another embodiment in which its characteristics is improved will be described.

Figure 3:
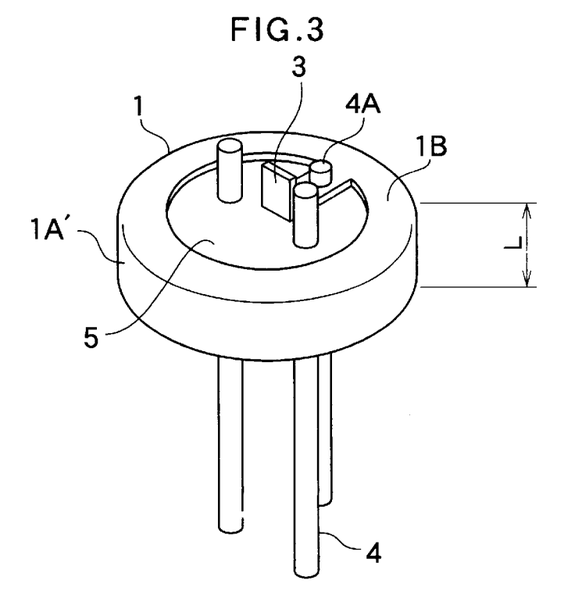
FIG. 3 is a perspective view showing the stem in the second embodiment of the present invention.

FIG. 3 shows a second embodiment of the present invention.

In the drawing, portions which are similar to those in FIG. 1 are designated by like numerals. Since the feature of this embodiment resides in that the device comprises the annular wall 1A' which is formed by bending the peripheral edge of the disc-shaped metal blank at substantially right angles thereto, a flat face 1B at the central portion thereof and a mounting 3 which erects on the flat face 1B, and on which the laser light emitting element and the like are mounted.

In this embodiment, said annular wall 1A' serves as a fin to provide a necessary heat dissipation ability by adjusting the width "L" of the annular wall.

Figure 4A:
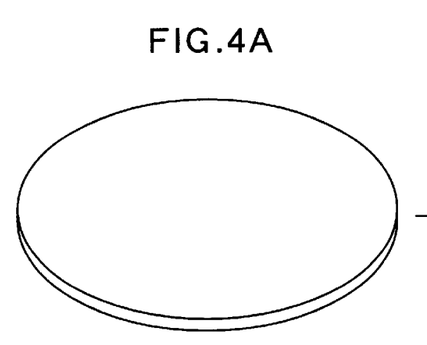
FIGS. 4A–4D provide a schematic view illustrating a process for manufacturing the base of the stem in the second embodiment.
Figure 4B:
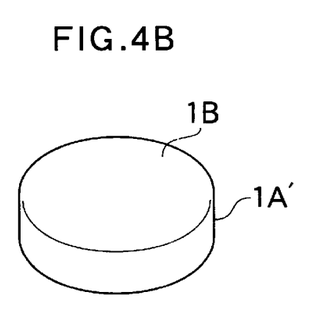
Figure 4C:
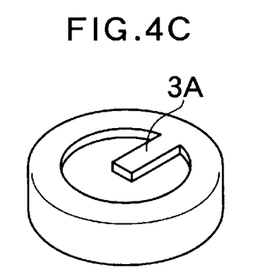
Figure 4D:
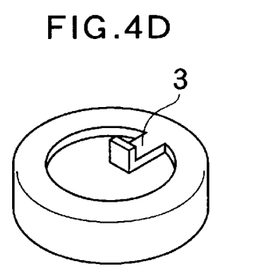

FIGS. 4A–4D show a process for manufacturing the base of the stem of the embodiment. FIG. 4A shows a metal blank. FIG. 4B shows an intermediate work piece in which a bent portion is formed by bending the peripheral edge of said metal blank downward to provide a flat face on its center. FIG. 4C shows that the central flat face of the intermediate work piece is punched to leave an extended portion 3A which will become a mounting 3 on which said laser light emitting element is mounted through the silicon sub-mount. FIG. 4D shows that said mounting (heat sink) 3 having an L-shaped section is formed by erecting the extended portion 3A.

Since the space within the annular side wall which is formed by 1A' which is formed by bending the peripheral edge of the base is filled with a thermo setting resins, the strength can be increased although the base 1 is formed of a thin sheet metal. No bending and warping takes place due to the fact that bent portion is used as an application reference face on mounting of the pickup.

Since the heat dissipation area can be increased by increasing the width L of the bent portion, the problem of heat dissipation on operation of an LD of the first embodiment can be avoided.

Figure 5A:
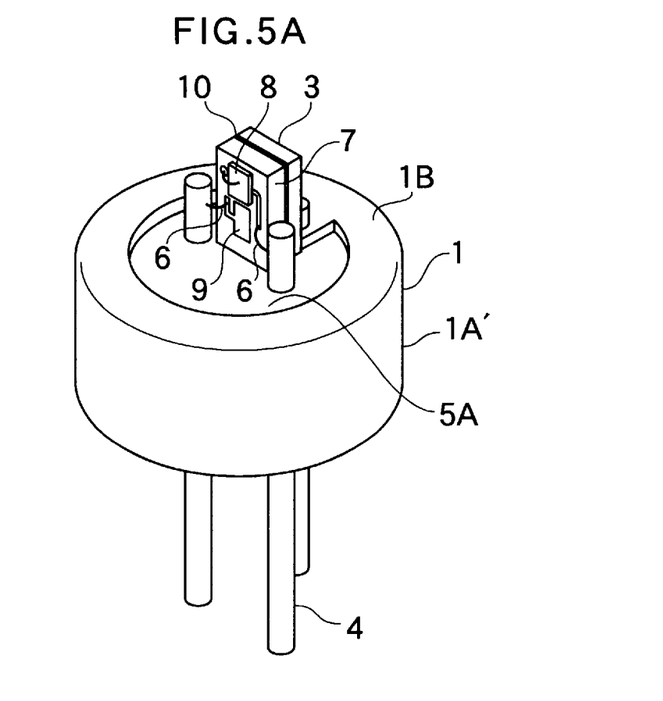
FIGS. 5A and 5B show the stem of the third embodiment of the semiconductor laser device of the present invention, FIGS. 5A and 5B being a perspective and sectional views of the stem, respectively.
Figure 5B:
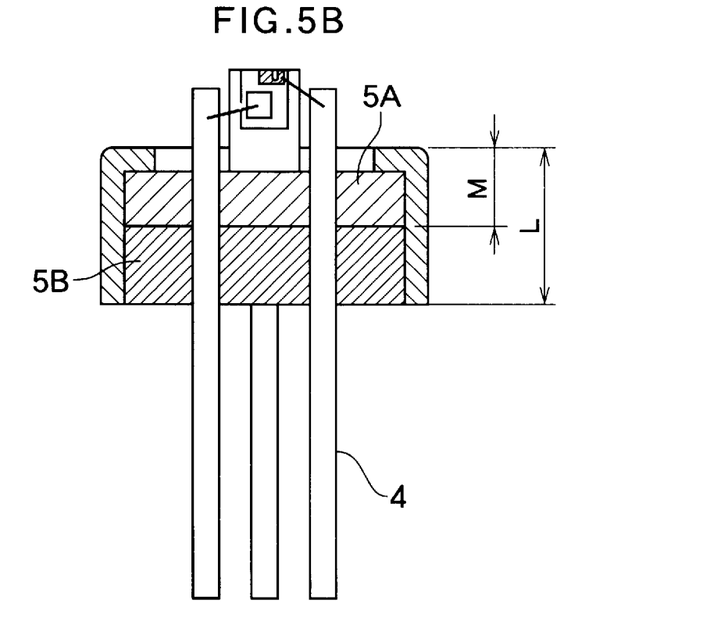

FIGS. 5A and 5B show a third embodiment of the stem of the present invention. FIGS. 5A and 5B show a third embodiment of the stem of the present invention. FIGS. 5A and 5B are perspective and sectional views, respectively.

The base 1 of the stem comprises an annular continuous wall 1A' having its peripheral edge which is bent downward at substantially right angles in FIG. 5A. A mounting (heat sink) 3 on which a laser light emitting element and the like are mounted through a silicon sub-mount 7 is formed on one side of an opening on the upper face 5B. An iron plate having a thickness of 0.1 mm to 0.5 mm as mentioned above is used as the sheet metal.

In the drawing, a reference numeral 6 denotes gold wires which electrically connect leads 4 to each terminal. 7 denotes a silicon sub-mount which is bonded to the folded face of the mounting (heat sink) 3 with an electrically conductive paste such as silver paste. 8 denotes an LD (laser diode) which is a light emitting element and 9 denotes a light receiving element for monitoring laser diode which is emitted from said LD. As shown in the drawing, both LD 8 and the light receiving element 9 are electrically connected to the leads 4 via the gold wires 6.

Since the thus formed stem has the annular wall 1A' which is formed by blending the outer peripheral edge of the base, the base 1 can be strengthened and the annular wall can be used for heat dissipation, or as a heat radiating fin. A necessary heat dissipation ability can be provided by the base per se.

In order to further increase the heat dissipation of the stem, a heat dissipation heat sink disc 5A made of copper is accommodated within a space surrounded by the annular, wall 1A' in such a manner that the disc 5A is insulated from the leads 4 as shown in FIG. 5B. The lower space is filled with an insulating thermosetting resin 5B for sealing the heat sink disc 5A with the outer lead.

Such as arrangement allows the heat dissipation to be adjusted by adjusting the thickness M of the heat dissipating heat sink disc as well as the width L of the continuous wall. Such the semiconductor laser device can be easily provided with an optimum heat dissipation.

The process for manufacturing the base of the stem of the present embodiment is similar to that of the second embodiment which has been described with reference to FIGS. 4A–4D. FIG. 4A shows a blank which is stamped from a thin iron plate having the above-mentioned thickness. FIG. 4B shows a bowl-like intermediate work piece having an annular continuous wall which is formed by bending the peripheral edge of said blank. FIG. 4C shows that the central flat portion of the intermediate work piece has been punched to leave a portion 3A which will become said mounting (heat sink). FIG. 4D shows the heat sink having an L-shaped section which is made by subjecting the portion 3A which will become said mounting (heat sink) 3 to a bending operation.

Figure 6A:
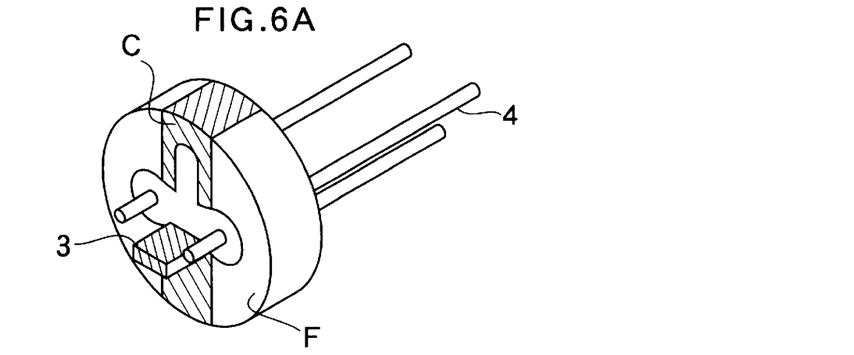
FIG. 6A is a perspective view of the stem of the fourth embodiment of the semiconductor laser device of the present invention and FIG. 6B is a plan view showing a blank for the base of the stem.

A fourth embodiment of the stem of the present indention in which its heat dissipation ability is enhanced will now be described. In this embodiment, the mounting (heat sink) 3 on which a laser light emitting element and the like are mounted through the silicon sub-mount of the stem is made of copper material C which is excellent in heat dissipation as shown in FIG. 6A. The peripheral portion of the base which requires less heat conduction is made of iron material F to reduce the cost and to assure necessary strength of the stem.

Figure 6B:
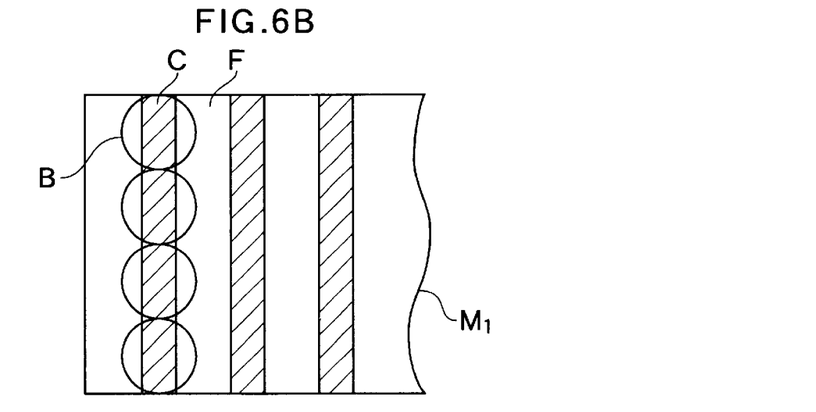

In order to manufacture the stem a cladding material M1 in which different metals are alternatingly cladded to each other in a stripe manner in order, for example, iron-copper-iron-copper is used as shown in FIG. 6B. A circular blank B made of the cladding material M1 is stamped. Working of sheet metal is conducted in such a manner that the copper portion of the blank B is positioned to form the mounting (heat sink) 3. The working process is identical with that of the third embodiment which has been described with (reference to FIGS. 4A–4D.

Figure 7A:
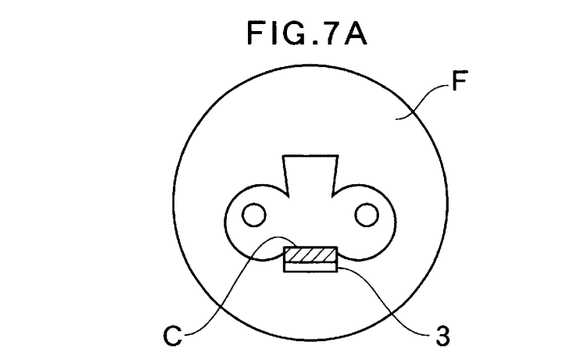
FIG. 7A is a plan view showing the stem of the fifth embodiment of the semiconductor laser device of the present invention and FIG. 7B is a sectional view showing a blank for the base of the stem.
Figure 7B:
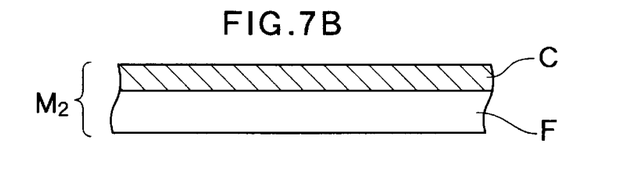

FIG. 7A is a plan view showing a fifth embodiment of the stem of the present invention as viewed from the upper position thereof. Although the cladding material M1 in which iron F and copper C are alternatingly cladded to each other in the fourth embodiment, a cladding material M2 in which a copper material and iron material F are laminated to each other in a depth direction of the plate is used (FIG. 7B). A blank for manufacturing the stem is stamped from the cladding material M2. The stem will be manufactured in accordance with the process which has been described with reference to FIG. 4.

In this case, the peripheral edge of the blank is bent at substantially right angles in such a manner that the iron material F is positioned on the upper side of the base of the stem. The central portion of the blank is punched to leave the heat sink which will become the silicon sub-mount. Finally, the mounting (heat sink) is bent so that it erects.

Erection of the mounting (heat sink) causes the copper material C which is located on the lower side to be positioned on the upper side. In other words, the copper material C is positioned on the side in which the silicon sub-mount is mounted as shown in FIG. 7A, so that copper which is excellent in heat conduction can be advantageously used. On the other hand, since the ion material F appears on the surface excepting the copper material area, excellent strength characteristics which the iron possesses can be advantageously used.

The above-mentioned features and/or combination thereof provide a stem which is excellent in strength and/or heat dissipation by advantageously making use of the characteristics of each material.

In any of the stems of the above-mentioned semiconductor laser devices, the laser device mounting is formed integrally with the base. However, in the stem of a sixth embodiment shown in FIG. 8A, the laser device mounting 3B is formed integrally with the outer leads 4 (ground terminal). The words "formed integrally' used herein not only literally includes "the laser device mounting is formed integrally with the outer leads", but also includes "bonded with by means such as welding".

Figure 8A:
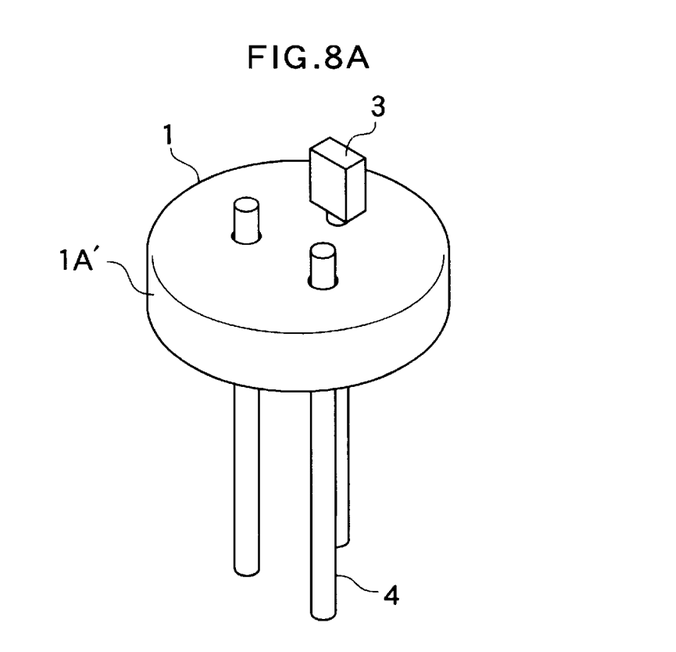
FIGS. 8A–8C show the stem of the sixth embodiment of the semiconductor laser device of the present invention, FIG. 8A being a perspective view of the stem and FIGS. 8B and 8C being sectional views of the stem.
Figures 8B, 8C:
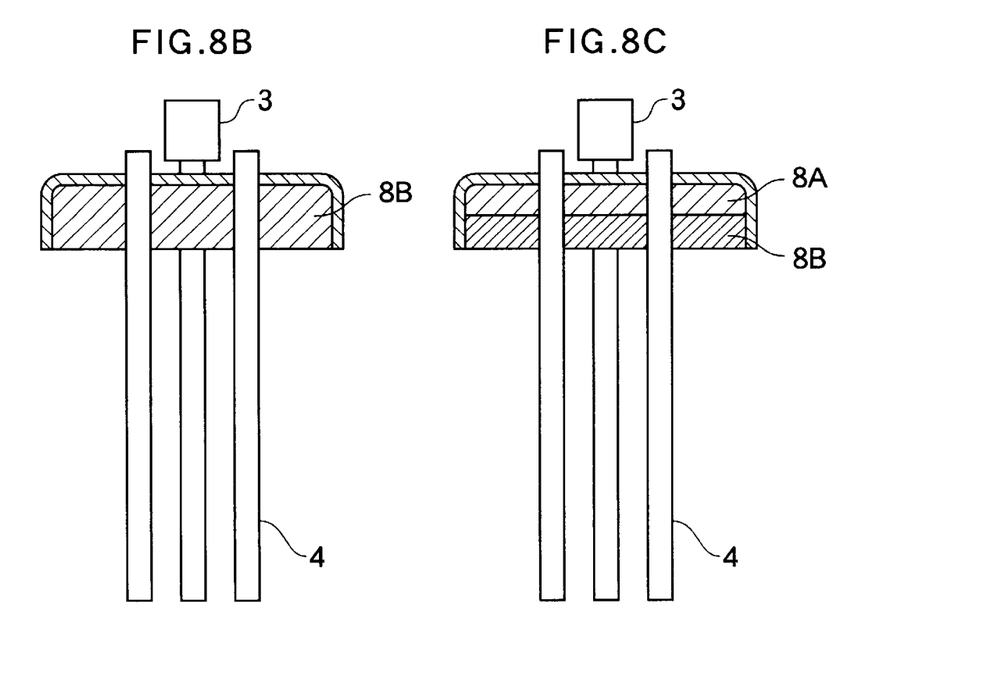

The outer leads 4 are fixed to the base 1 with an insulating thermosetting resin which is charged in a space surrounded by the bent annular wall 1A' of the base 1 (FIG. 8B).

Since the thus formed stem is provided with an annular wall 1A' which is formed by bending the outer peripheral edge of the base similarly to second embodiment, necessary heat dissipation can be assured by the base per se.

Similarly to the third embodiment, a heat sink disc 8A for heat dissipation, which is made of copper may be accommodated in a space surrounded by the annular wall 1A' in such a manner that it is insulated from the outer leads. Further, an insulating thermosetting resin may be charged into a lower space for sealing the heat sink disc together with the outer leads (FIG. 8C).

Figure 9A:
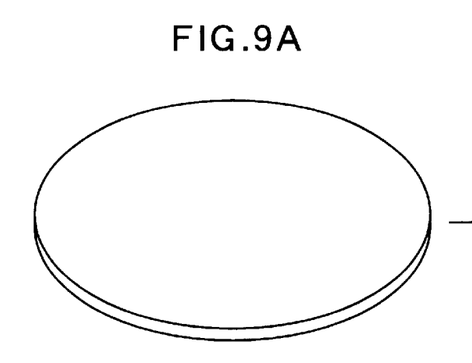
FIGS. 9A–9C provide a perspective view illustrating a process for manufacturing the base of the stem of the sixth embodiment.
Figure 9B:
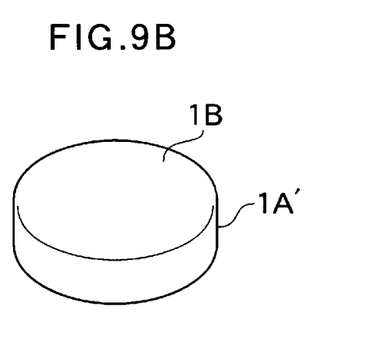
Figure 9C:
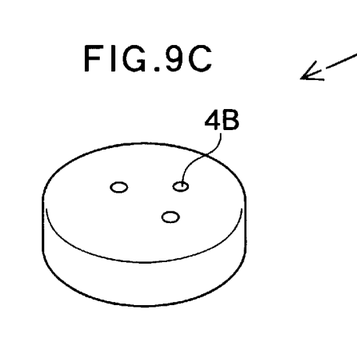

FIGS. 9A–9C illustrate a process for forming the base of the stem. FIG. 9A shows a blank of a sheet metal such as iron plate. FIG. 9B shows an intermediate work piece having a bent portion which is formed by bending the peripheral edge of the blank downward and a flat central face. FIG. 9C shows the base 1 in which the intermediate work piece is formed on its flat face with a hole 4B through which the leads extend.

What is claimed is:

1. A semiconductor laser device comprising:
a stem having a base,
a mounting for a laser light emitting element, which is integrally formed on the base, and a plurality of outer leads at least one lead being connected to said light emitting element, wherein said base comprises a sheet metal piece having a central portion and a first mechanically bent portion forming an outer annular wall;
wherein said outer leads are bonded to said base with a thermosetting resin which is charged within said annular wall.

2. A semiconductor laser device comprising:
a stem having a base,
a mounting for a laser light emitting element, which is integrally formed on the base, and a plurality of outer leads at least one lead being connected to said light emitting element, wherein said base comprises a sheet metal piece having a central portion and a first mechanically bent portion forming an outer annular wall, wherein said base has a peripheral edge and said annular wall is formed at the peripheral edge and the mounting for said laser light emitting element is disposed at said annular wall and comprises a second mechanically bent portion formed from the central portion of the sheet metal piece;
wherein said outer leads are bonded to said base with a thermosetting resin which is charged within said annular wall.

3. A semiconductor laser device comprising:
a stem having a base,
a mounting for a laser light emitting element, which is integrally formed on the base, and a plurality of outer leads at least one lead being connected to said light emitting element, wherein said base comprises a sheet metal piece having a central portion and a first mechanically bent portion forming an outer annular wall;
wherein said outer leads and said base are plated with different materials.

4. A semiconductor laser device comprising:
a stem having a base,
a mounting for a laser light emitting element, which is integrally formed on the base, and a plurality of outer leads at least one lead being connected to said light emitting element, wherein said base comprises a sheet metal piece having a central portion and a first mechanically bent portion forming an outer annular wall, wherein said base has a peripheral edge and said annular wall is formed at the peripheral edge and the mounting for said laser light emitting element is disposed at said annular wall and comprises a second mechanically bent portion formed from the central portion of the sheet metal piece;
wherein said outer leads and said base are plated with different materials.

5. A semiconductor laser device comprising:
a stem having a base,
a mounting for a laser light emitting element, which is integrally formed on the base, and a plurality of outer leads at least one lead being connected to said light emitting element, wherein said base comprises a sheet metal piece having a central portion and a first mechanically bent portion forming an outer annular wall;
wherein said annular wall is a heat dissipating fin.

6. A semiconductor laser device comprising:
a stem having a base,
a mounting for a laser light emitting element, which is integrally formed on the base, and a plurality of outer leads at least one lead being connected to said light emitting element, wherein said base comprises a sheet metal piece having a central portion and a first mechanically bent portion forming an outer annular wall, wherein said base has a peripheral edge and said annular wall is formed at the peripheral edge and the mounting for said laser light emitting element is disposed at said annular wall and comprises a second mechanically bent portion formed from the central portion of the sheet metal piece;

wherein said annular wall is a heat dissipating fin.

7. A semiconductor laser device including:

a stem, wherein said stem comprises:

a base having a peripheral edge and an annular wall which is formed at said peripheral edge of a mechanically bent sheet metal, and a heat sink member separately formed from said annular wall and being sealed in said annular wall.

8. A semiconductor laser device as defined in claim 7, wherein said heat sink member is an insulated copper material.

9. A semiconductor laser device as defined in claim 7, wherein said heat sink member is adjustable in thickness.

10. A semiconductor laser device including:

a stem, wherein said stem comprises a laser light emitting element and base, said base comprising a sheet metal piece having a bent portion defining a peripheral edge and an annular wall;

said sheet metal piece comprising a cladding material formed from two metals having different heat conductivities and cladded to each other in a stripe manner, and a mounting for the laser light emitting element, which is integrally formed on at least said base, and is formed of a metal having a higher heat conductivity of said different metals.

11. A semiconductor laser device as defined in claim 10, wherein one of the metals having different heat conductivities is iron and the other is copper.

12. A semiconductor laser device including a stem, wherein said stem comprises:

a laser light emitting element and a base, said base having at a peripheral edge an annular wall which is formed of a bent cladding material said cladding material comprising two metals having different conductivities that are cladded to each other in a stripe manner, and at a central portion a mounting for the laser light emitting element, which is integrally formed on said base of a metal having a higher heat conductivity of said different metals.

13. A semiconductor laser device as defined in claim 12, wherein one of the metals having different heat conductivities is iron and the other is copper.

* * * * *